(12) United States Patent
Tung et al.

(10) Patent No.: US 12,745,383 B2
(45) Date of Patent: Sep. 22, 2026

(54) SEMICONDUCTOR DEVICE COMPRISING A CONNECTING LAYER INCLUDING AN ARRAY OF CONNECTING PADS AND A CAPACITIVE STRUCTURE

(71) Applicant: Fujian Jinhua Integrated Circuit Co., Ltd., Quanzhou City (CN)

(72) Inventors: Yu-Cheng Tung, Quanzhou City (CN); Janbo Zhang, Quanzhou City (CN)

(73) Assignee: Fujian Jinhua Integrated Circuit Co., Ltd., Quanzhou City (CN)

(*) Notice: Subject to any disclaimer, the term of this patent is extended or adjusted under 35 U.S.C. 154(b) by 439 days.

(21) Appl. No.: 18/369,834

(22) Filed: Sep. 18, 2023

(65) Prior Publication Data

US 2024/0381617 A1 Nov. 14, 2024

(30) Foreign Application Priority Data

May 11, 2023 (CN) ........................ 202310530817.9
May 11, 2023 (CN) ........................ 202321132522.8

(51) Int. Cl.
*H10B 12/00* (2023.01)

(52) U.S. Cl.
CPC ....... *H10B 12/0335* (2023.02); *H10B 12/315* (2023.02)

(58) Field of Classification Search
CPC .. H10B 12/0335; H10B 12/315; H10D 1/716; B10B 12/0335; B10B 12/315
See application file for complete search history.

(56) References Cited

U.S. PATENT DOCUMENTS

| | | | | |
|---|---|---|---|---|
| 9,806,080 | B2 | 10/2017 | Yoo | |
| 10,497,775 | B2 | 12/2019 | Lee | |
| 2006/0003235 | A1 | 1/2006 | Sugimoto | |
| 2013/0292796 | A1* | 11/2013 | Cho | H10D 1/042 257/532 |
| 2017/0098601 | A1 | 4/2017 | Lim | |
| 2018/0342519 | A1* | 11/2018 | Kim | H10D 1/716 |
| 2020/0212047 | A1 | 7/2020 | Park | |
| 2022/0139919 | A1* | 5/2022 | Li | H10B 12/033 257/532 |
| 2022/0262721 | A1* | 8/2022 | Choi | H10B 12/482 |
| 2023/0039823 | A1* | 2/2023 | Jeong | H10B 12/315 |
| 2023/0363147 | A1* | 11/2023 | Sohn | H10B 12/48 |

FOREIGN PATENT DOCUMENTS

| | | | |
|---|---|---|---|
| CN | 100399508 | C | 7/2008 |
| WO | 2005083515 | A1 | 9/2005 |

* cited by examiner

*Primary Examiner* — Khiem D Nguyen
(74) *Attorney, Agent, or Firm* — Winston Hsu

(57) ABSTRACT

A semiconductor device includes a substrate, a connecting layer on the substrate, and a capacitor structure arranged on the connecting layer. The connecting layer includes an array of connecting pads, a peripheral structure adjacent to the array of connecting pads, and a plurality of first extending pads arranged between the peripheral structure and the array of connecting pads. The connecting pads respectively have one of the bottom electrodes of the capacitor structure disposed thereon. The first extending pads respectively have two of the bottom electrodes of the capacitor structure disposed thereon to reinforce the peripheral portions of the capacitor structure.

19 Claims, 8 Drawing Sheets

SEMICONDUCTOR DEVICE COMPRISING A CONNECTING LAYER INCLUDING AN ARRAY OF CONNECTING PADS AND A CAPACITIVE STRUCTURE

BACKGROUND OF THE INVENTION

1. Field of the Invention

The present invention relates to a semiconductor device. More particularly, the present invention relates to a semiconductor device including a capacitor structure stacked on a connecting layer.

2. Description of the Prior Art

A dynamic random access memory (DRAM) device is a kind of volatile memory. A DRAM device usually includes a memory region including an array of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In recent years, high-density and high integrity DRAM devices with larger storage capacities are earnestly required in the industry to produce smaller and advanced electronic products. Three dimensional (3D) memory cells having buried word lines and stacked capacitors have been proposed in the field to meet the above requirements. Stacked capacitors are vertically disposed on the substrate, so that the substrate area occupied by the capacitors may be saved. Furthermore, the capacitances of stacked capacitors may be increased for a better device performance by simply increasing the vertical heights of the stacked capacitors. However, DRAMs with stacked capacitors still have problems need to be solved, such as structural collapse particularly near the array peripheral region.

SUMMARY OF THE INVENTION

One objective of the present invention is to provide a semiconductor device including a capacitor structure disposed on a connecting layer. The bottom electrodes of the capacitor structure are electrically connected to the transistors in the substrate through the connecting pads of the connecting layer. One feature of the present invention is that the connecting layer further includes extending pads on which the bottom electrodes (dummy bottom electrodes) in the peripheral portions of the capacitor structure are selectively disposed, so that the peripheral portions of the capacitor structure may obtain more structural supports, and risks of structural deformation or collapse may be reduced. The integrity, stability and quality of the semiconductor device provided by the present invention may be overall improved.

One embodiment of the present invention provides a semiconductor device including a substrate, a connecting layer on the substrate, and a capacitor structure on the connecting layer. The connecting layer includes an array of connecting pads including a plurality of connecting pads arranged along a first direction and a second direction, a peripheral structure including a first edge and a second edge adjacent to two adjacent sides of the array of connecting pads, and a plurality of first extending pads arranged between the first edge of the peripheral structure and the array of connecting pads. The capacitor structure includes a plurality of bottom electrodes, wherein the connecting pads respectively have one of the bottom electrodes disposed thereon, the first extending pads respectively have two of the bottom electrodes disposed thereon.

Another embodiment of the present invention provides a semiconductor device including a substrate, a connecting layer on the substrate, and a capacitor structure on the connecting layer. The connecting layer includes an array of connecting pads comprising a plurality of connecting pads arranged along a first direction and a second direction, a peripheral structure comprising a first edge and a second edge adjacent to two adjacent sides of the array of connecting pads, and a plurality of first extending pads and second extending pads alternately arranged between the first edge of the peripheral structure and the array of connecting pads. Along the first direction, lengths of the first extending pads are larger than lengths of the second extending pads. The capacitor structure includes a plurality of bottom electrodes, wherein the connecting pads respectively have one of the bottom electrodes disposed thereon, the first extending pads respectively have a number N+1 of the bottom electrodes disposed thereon, the second extending pads respectively have the number N of the bottom electrodes disposed thereon.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
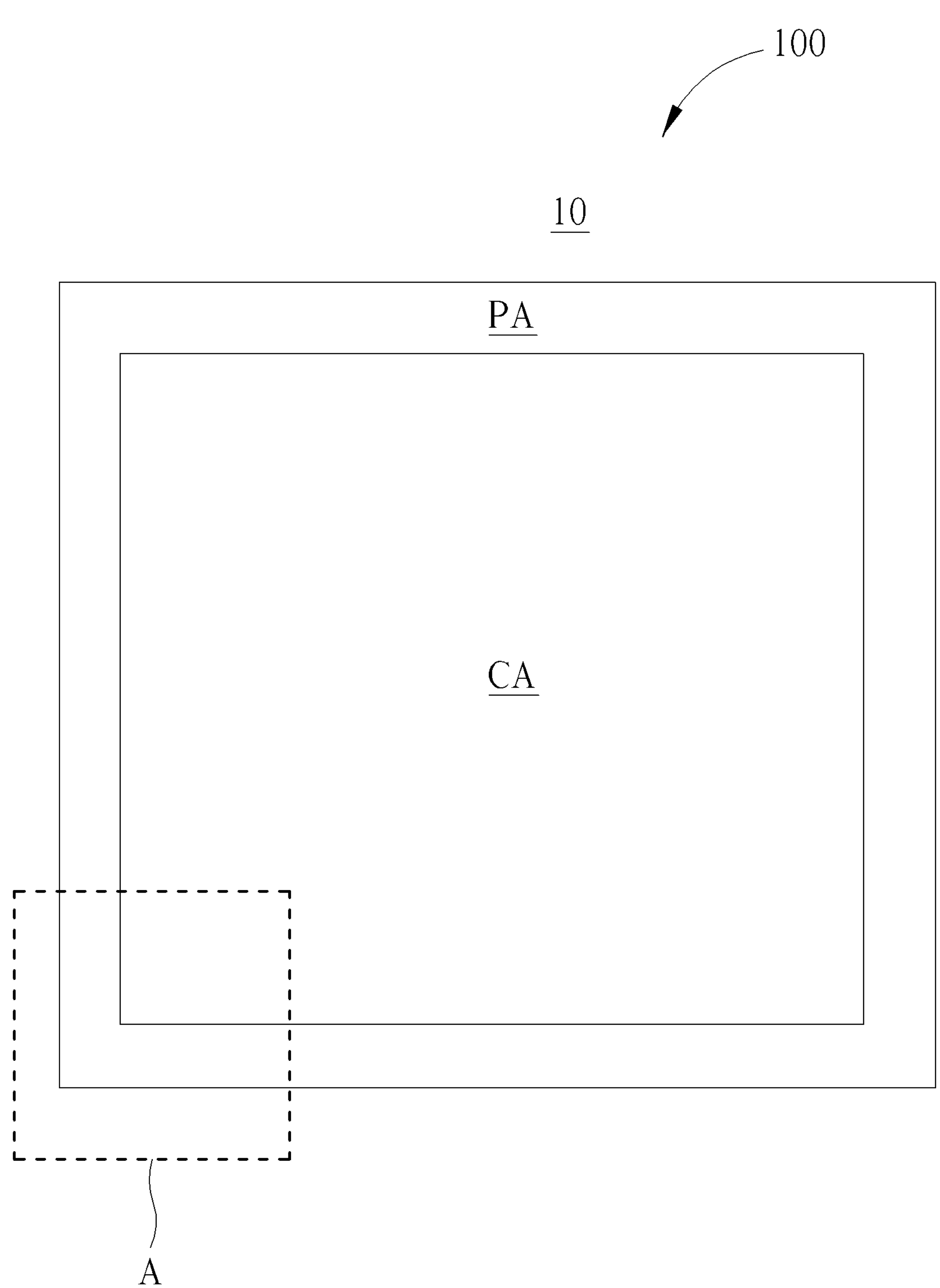
FIG. 1 is a plane view of a semiconductor device according to an embodiment of the present invention.

Please refer to FIG. 1, which is a plane view of a semiconductor device 100 according to an embodiment of the present invention. The semiconductor device 100 includes a substrate 10, such as a silicon substrate, an epitaxial silicon substrate, a silicon germanium (SiGe) substrate, a silicon carbide (SiC) substrate, or a silicon-on-insulator (SOI) substrate, but is not limited thereto. The substrate 10 includes at least a cell region CA and a peripheral region PA that is adjacent to the edges of the cell region CA. The cell region CA is where the memory cells are formed, and is separated from other circuit regions of the substrate 10 by the peripheral region PA. In some embodiments, the cell region CA is completely surrounded by the peripheral region PA.

Figure 2:
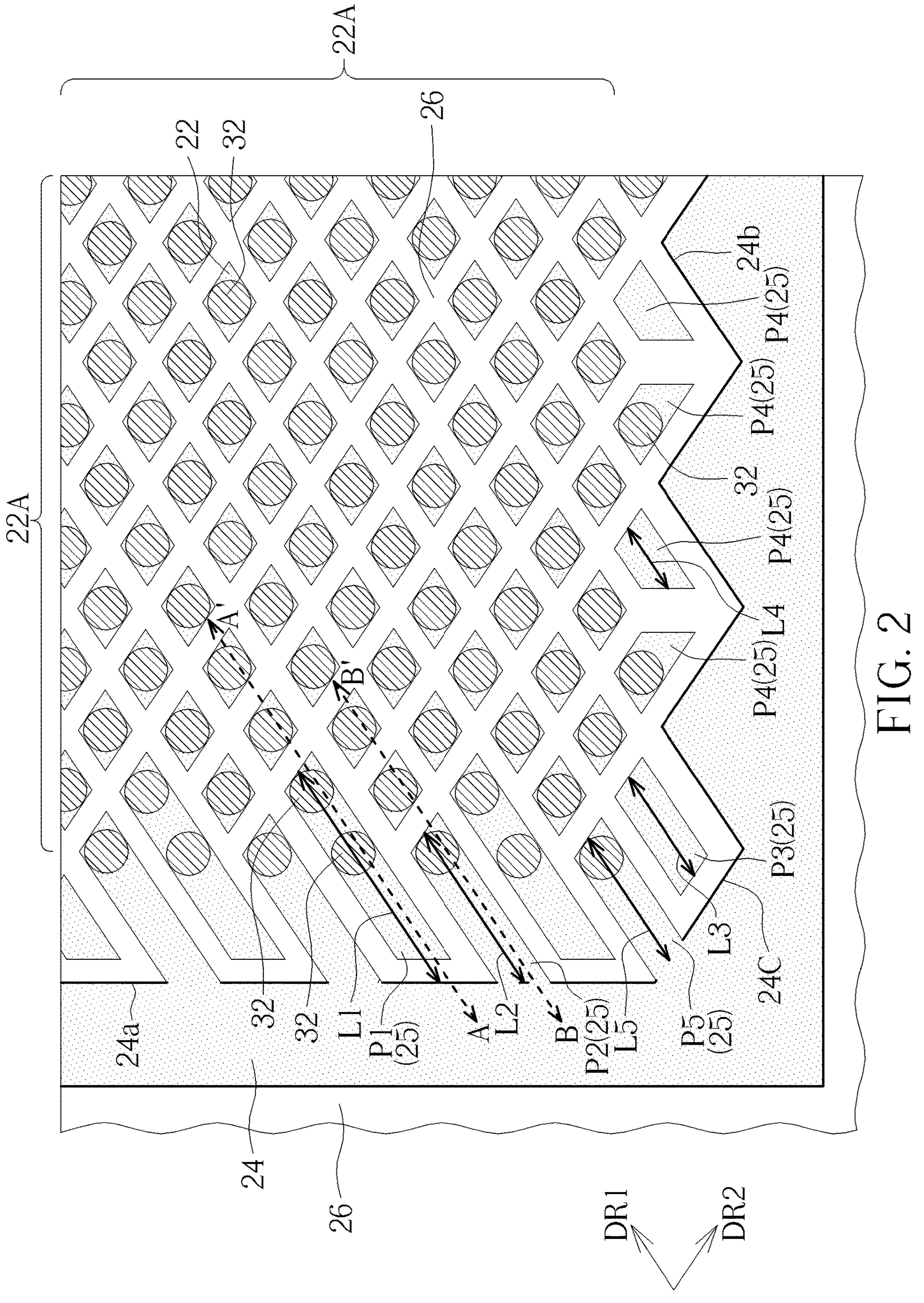
FIG. 2 is a partial enlarged view of the semiconductor device shown in FIG. 1.
Figure 3:
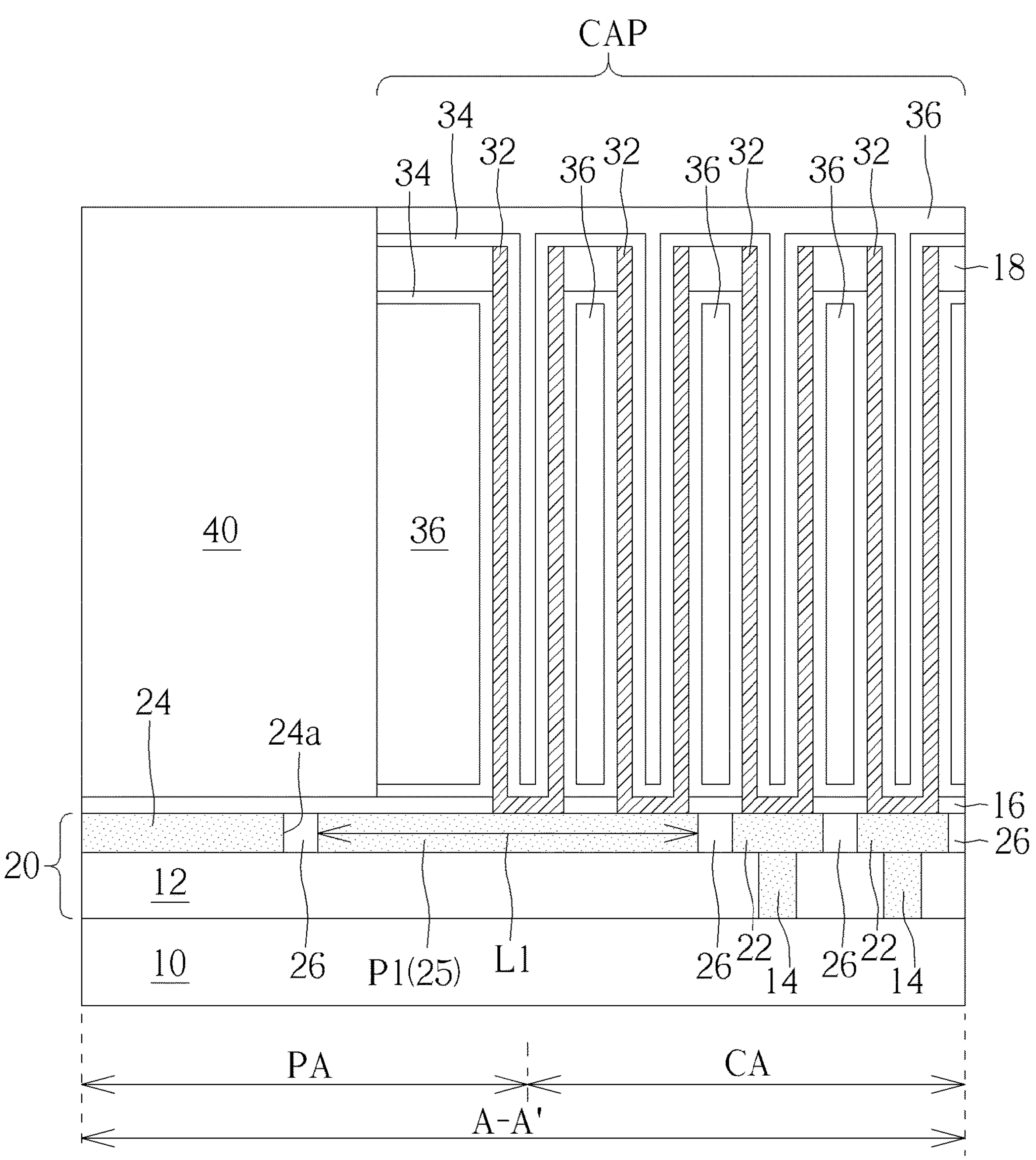
FIG. 3 is a cross-sectional view of the semiconductor device along line AA' shown in FIG. 2.
Figure 4:
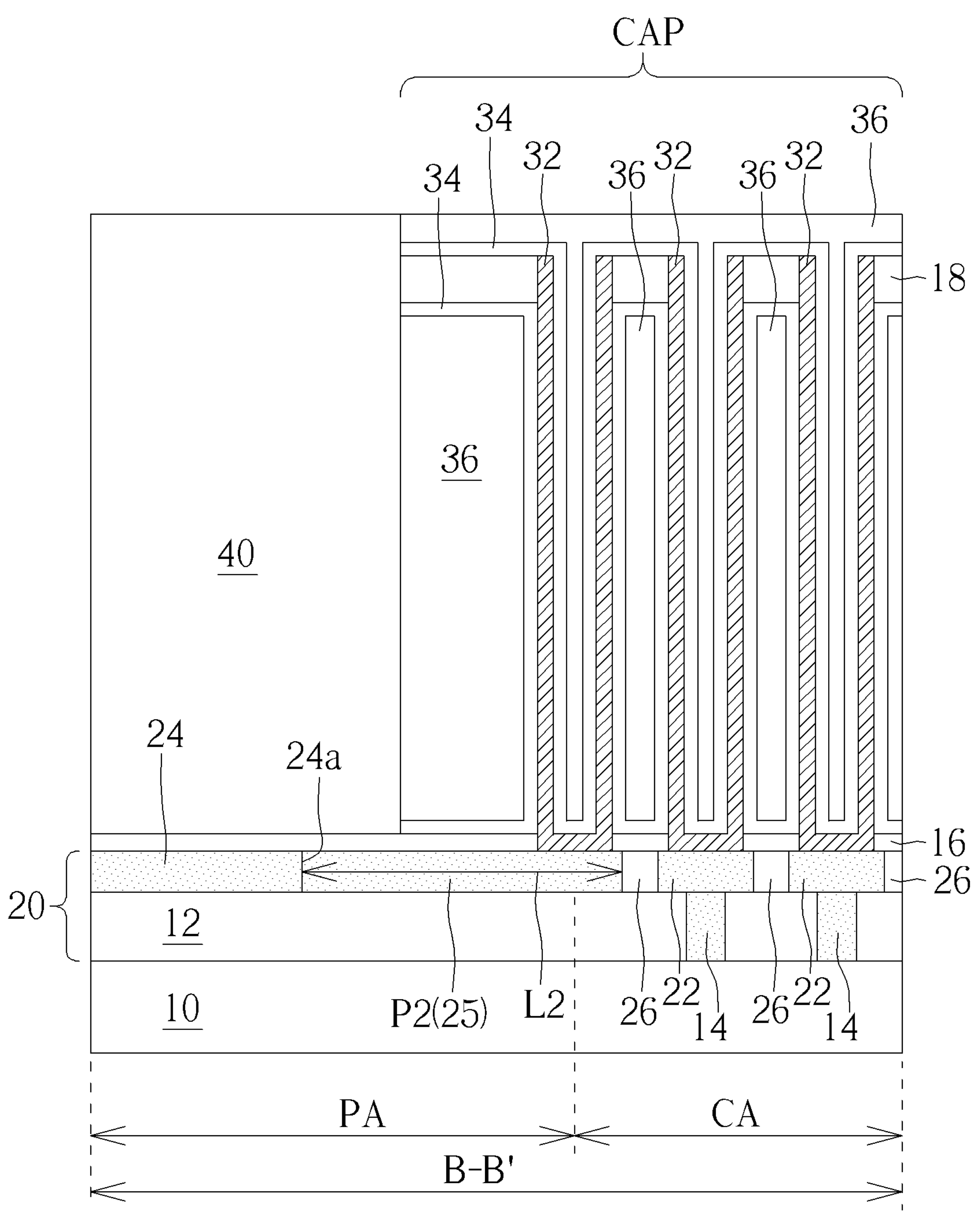
FIG. 4 is a cross-sectional view of the semiconductor device along line BB' shown in FIG. 2.

Please refer to FIG. 2, FIG. 3 and FIG. 4. FIG. 2 is an enlarged view of the region A of the semiconductor device 100, wherein the region A includes a corner portion of the cell region CA and the peripheral region PA. FIG. 3 is a cross-sectional view of the semiconductor device 100 along the line AA' shown in FIG. 2. FIG. 4 is a cross-sectional view of the semiconductor device 100 along the line BB' shown in FIG. 2.

In order to simplify the drawings, some components shown in the cross-sectional views in FIG. 3 and FIG. 4, such as contact plugs 14, the capacitor structure CAP, the supporting layer 18, the capacitor dielectric layer 34, the top electrode 36 and the planarization layer 40 are not shown in the plane view in FIG. 2.

The semiconductor device 100 is a dynamic random access memory (DRAM) device including stacked capacitors. More particularly, the semiconductor device 100includes a connecting layer 20 disposed on the substrate 10 and a capacitor structure CAP disposed on the connecting layer 20. Circuit elements to control read, write or erase operations of the memory cells such as, but not limited thereto, transistors, buried word lines, bit lines, contact plugs formed in the substrate 10 or on the substrate 10, and are not shown in the drawings for the sake of simplicity.

The capacitor structure CAP is a block structure disposed on the connecting layer 20, directly overlapping the cell region CA and extending to partially overlap the peripheral region PA. The capacitor structure CAP includes a plurality of bottom electrodes 32 standing vertically on the connecting layer 20, a capacitor dielectric layer 34 conformally covering the surfaces of the bottom electrodes 32, and a top electrode 36 on the capacitor dielectric layer 34 and capacitively coupled with the bottom electrodes 32 through the capacitor dielectric layer 34. The bottom electrodes 32 and the top electrode 36 may respectively include a conductive material, such as a metal including tungsten (W), copper (Cu), aluminum (Al), titanium (Ti), tantalum (Ta), a compound, an alloy or a composite layer of the above metal materials, but is not limited thereto. In some embodiments, the top electrode 36 may include a semiconductor material, such as polysilicon. The capacitor dielectric layer 34 may include a dielectric material, such as silicon oxide (SiO2), silicon nitride (SiN), or a high-k dielectric material, but is not limited thereto.

The capacitor structure CAP further includes a supporting layer 18, which extends laterally and directly contacts the bottom electrodes 32 to support the bottom electrodes 32. In some embodiments, an etching stop layer 16 may be provided between the capacitor structure CAP and the connecting layer 20, and the bottom portions of the bottom electrodes 32 extend through the etching stop layer 16 to directly contact the conductive structure (such as the landing pads 22) of the connecting layer 20. The supporting layer 18 and the etching stop layer 16 may respectively include a dielectric material, such as silicon nitride (SiN), silicon carbide (SiC), silicon carbon nitride (SiCN), nitride doped silicon carbide (NDC), but is not limited thereto.

The planarization layer 40 disposed on the connecting layer 20 may planarize the surface topography between the capacitor structure CAP and other regions of the substrate 10. In some embodiments, the top surface of the planarization layer 40 and the top surface of the capacitor structure CAP may be flush with each other. The planarization layer 40 may include a dielectric material, such as silicon oxide ($SiO_2$), but is not limited thereto. In some embodiments, the etching stop layer 16 may also be provided between the connecting layer 20 and the planarization layer 40.

The connecting layer 20 is disposed between the substrate 10 and the capacitor structure CAP, and includes dielectric layers and conductive structures formed in the dielectric layer. For example, as shown in FIG. 2, FIG. 3 and FIG. 4, the connecting layer 20 may include a first dielectric layer 12 and a second dielectric layer 26 on the first dielectric layer 12, a plurality of contact plugs 14 disposed in the first dielectric layer 12, and a plurality of connecting pads 22, a peripheral structure 24, and a plurality of extending pads 25 disposed in the second dielectric layer 26, wherein the extending pads 25 are arranged between the connecting pads 22 and the peripheral structure 24. The first dielectric layer 12 and the second dielectric layer 26 respectively include a dielectric material, such as silicon oxide ($SiO_2$) or silicon nitride (SiN), but is not limited thereto. The contact plugs 14, the connecting pads 22, the peripheral structure 24, and the extending pads 25 (including the first extending pads P1, the second extending pads P2, the third extending pad P3, the fourth extending pads P4, and the fifth extending pad P5) include a conductive material, such as a metal including tungsten (W), copper (Cu), aluminum (Al), titanium (Ti), tantalum (Ta), a compound, an alloy or a composite layer of the above metal materials, but is not limited thereto. According to an embodiment of the present invention, the connecting pads 22, the peripheral structure 24, and the extending pads 25 are formed by patterning a same conductive material layer.

The connecting pads 22 are formed directly over the cell region CA of the substrate 10, and are arranged along the first direction DR1 and the second direction DR2 to form an array 22A. The connecting pads 22 are respectively in direct contact with a bottom electrode 32 of the capacitor structure CAP and a contact plug 14 in the first dielectric layer 12, thereby allowing the bottom electrode 32 being electrically connected to the associated circuit elements in or on the substrate 10. The bottom electrodes 32 respectively disposed on the connecting pads 22 are the storage nodes of the semiconductor device 100.

The peripheral structure 24 is formed directly over the peripheral region PA of the substrate 10, and may continuously extend along the outside of the array 22A of the connecting pads 22 to partially or completely surround the array 22A. For the convenience and clarity of description, the edges of the peripheral structure 24 nearby the two adjacent sides of the array 22A are defined as the first edge 24*a* and the second edge 24*b*, and the portion connected between the first edge 24*a* and the second edge 24*b* is defined as the third edge 24*c*. The first edge 24*a*, the second edge 24*b* and the third edge 24*c* respectively extend along different directions and may have the same or different profiles. In some embodiments, the extending directions of the first edge 24*a* and the second edge 24*b* are perpendicular to each other. In some embodiments, the first edge 24*a* has a straight profile, the second edge 24*b* has a wave profile, and the third edge 24*c* has a straight or curved profile.

The extending pads 25 are arranged between the peripheral structure 24 and the array 22A of the connecting pads 22. The extending pads 25 may have different shapes and lengths depending on their locations. Using the extending pads 25 shown in FIG. 2 as examples, for the convenience and clarity of description, the extending pads 25 may be further divided into first, second, third, fourth, and fifth extending pads P1, P2, P3, P4 and P5 depending on the locations and shapes. Please refer to following description for details.

The first extending pads P1 and the second extending pads P2 are alternately arranged between the first edge 24*a* of the peripheral structure 24 and the array 22A of connecting pads 22. The first extending pads P1 and the second extending pads P2 respectively have a long segment shape, having a long axis extending along the first direction DR1 and aligned with the connecting pads 22 along the first direction DR1. The first extending pads P1 are physically separated from the first edge 24*a* by the second dielectric layer 26. Each of the second extending pads P2 has a terminal end physically connected to the first edge 24*a* and the other terminal end being flush with the end of an adjacent first extending pad P1 along the second direction DR2. In some embodiments, the lengths L1 of the long axes of the first extending pads P1 are larger than the lengths L2 of the long axes of the second extending pads P2.

The third extending pad P3 is arranged between the third edge 24*c* and the array 22A of connecting pads 22, and is physically separated from the third edge 24*c* by the second dielectric layer 26. The third extending pad P3 has a segment shape having a long axis extending along the first direction DR1 and aligned with the connecting pads 22 along the first direction DR1. In some embodiments, the lengths L1 of the first extending pads and the lengths L2 of the second extending pads P2 are larger than the length L3 of the long axis of the third extending pad P3.

The fourth extending pads P4 are arranged between the second edge 24*b* and the array 22A of the connecting pads 22, and are physically separated from the second edge 24*b* by the second dielectric layer 26. In some embodiments, the fourth extending pads P4 may be island-shaped structures wherein the major axis and the minor axis of each of the fourth extending pads P4 may be indistinguishable. In some embodiments, the fourth extending pads P4 may be short segment structures wherein the length of the major axis is slightly larger than the length of the minor axis of each of the fourth extending pads P4. In some embodiments, the fourth extending pads P4 are arranged along the wave profile of the second edge 24*b* and have the long axes alternately parallel to first direction DR1 or the second direction DR2. In some embodiments, the length L3 of the long axis of the third extending pad P3 is larger than the lengths L4 of the fourth extending pads P4.

The fifth extending pad P5 is arranged between the third extending pad P3 and the first extending pads P1 adjacent to the third extending pad P3. A terminal end of the fifth extending pad P5 is physically connected to the third edge 24*c* of the peripheral structure 24. The fifth extending pad P5 has a long segment shape, having a long axis extending along the first direction DR1 and aligned with the connecting pads 22 along the first direction DR1. In some embodiments, the length L5 of the long axis of the fifth extending pad P5 is larger than the length L3 of the long axis of the third extending pad P3, and is smaller than the lengths L1 of the long axes of the first extending pad P1. In some embodiments, the length L5 of the long axis of the fifth extending pad P5 is smaller than the lengths L1 of the long axes of the first extending pad P1 and the length L2 of the long axes of the second extending pad P2.

In some embodiments, the peripheral structure 24, the extending pads 25 (including the first extending pads P1, the second extending pads P2, the third extending pad P3, the fourth extending pads P4, and the fifth extending pad P5) are not electrically connected to other parts of the semiconductor device 100, and are electrically floating.

One feature of the present invention is that some of the bottom electrodes 32 (electrically floating dummy bottom electrodes) in the peripheral portions of the capacitor structure CAP are selectively disposed on the extending pads 25, so that the peripheral portions of the capacitor structure CAP may obtain more structural supports. The risks of structural deformation or collapse may be reduced. The integrity, stability and quality of the semiconductor device 100 may be overall improved.

The numbers of the bottom electrodes 32 on the extending pads 25 may vary depending on the lengths and locations of the extending pads 25. For example, when the second extending pads P2 respectively have N bottom electrodes 32 disposed thereon, the first extending pads P1 that have longer lengths than the second extending pads P2 may respectively have N+1 bottom electrodes 32 disposed thereon. The third extending pad P3, the fourth extending pads P4, and the fifth extending pad P5 that have shorter lengths than the second extending pads P2 may respectively have N, N−1, or no bottom electrodes 32 disposed thereon. In some embodiments, N is preferably 0, 1 or 2. Some exemplary embodiments of the arrangements of the bottom electrodes 32 and the extending pads 25 will be described below for a better understanding of the present invention.

Please refer to FIG. 2, which shows an embodiment in which N is 1. The first extending pads P1 respectively have two bottom electrodes 32 disposed thereon. The second extending pads P2 and the fifth extending pad P5 respectively have one bottom electrode 32 disposed thereon. The fourth extending pads P4 alternately have one bottom electrode 32 and no bottom electrode 32 disposed thereon. The third extending pad P3 has no bottom electrode 32 disposed thereon.

Figure 5:
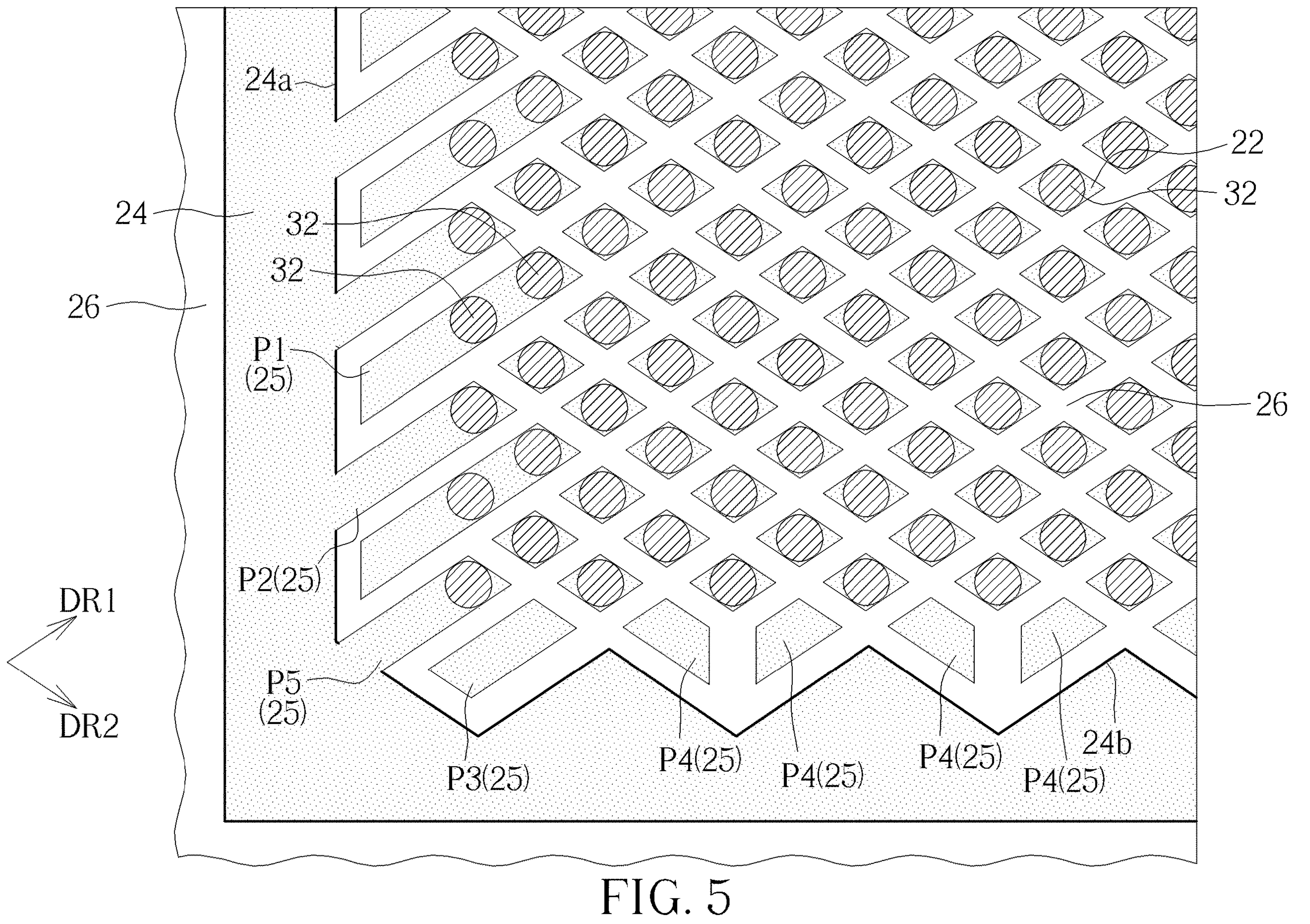
FIG. 5 is a partial enlarged view of a semiconductor device according to an embodiment of the present invention.

Please refer to FIG. 5, which shows another embodiment in which N is 1. The first extending pads P1 respectively have two bottom electrodes 32 disposed thereon. The second extending pads P2 and the fifth extending pad P5 respectively have one bottom electrode 32 disposed thereon. The fourth extending pads P4 and the third extending pad P3 respectively have no bottom electrode 32 disposed thereon.

Figure 6:
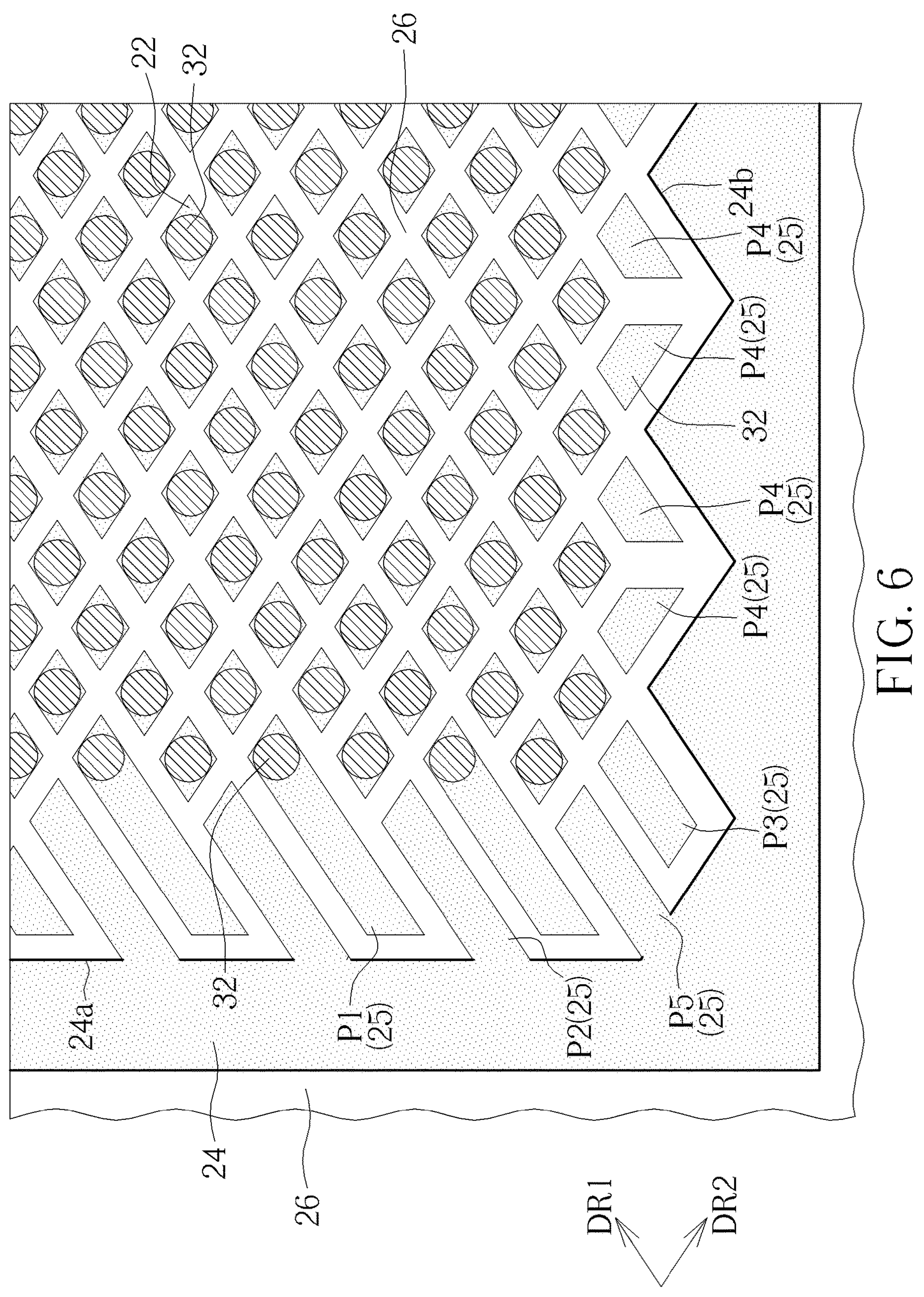
FIG. 6 is a partial enlarged view of a semiconductor device according to an embodiment of the present invention.

Please refer to FIG. 6, which shows an embodiment in which N is 0. The first extending pads P1 respectively have one bottom electrode 32 disposed thereon. The second extending pads P2, the third second extending pad P3, the fourth extending pads P4, and the fifth extending pad P5 respectively have no bottom electrode 32 disposed thereon.

Figure 7:
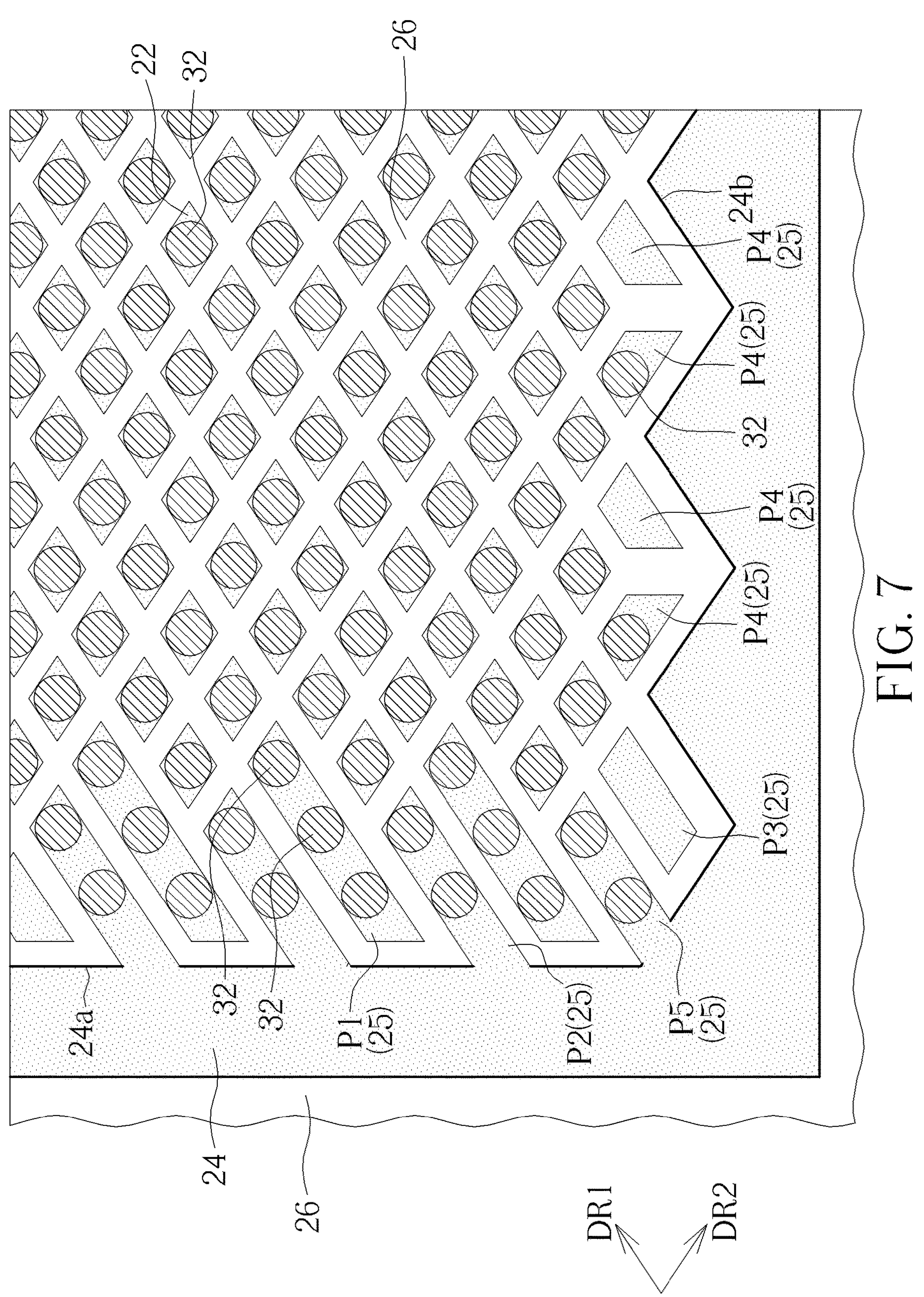
FIG. 7 is a partial enlarged view of a semiconductor device according to an embodiment of the present invention.

Please refer to FIG. 7, which shows an embodiment in which N is 2. The first extending pads P1 respectively have three bottom electrodes 32 disposed thereon. The second extending pads P2 and the fifth extending pad P5 respectively have two bottom electrodes 32 disposed thereon. The fourth extending pads P4 alternately have one bottom electrode 32 and no bottom electrode 32 disposed thereon. The third extending pad P3 has no bottom electrode 32 disposed thereon.

Figure 8:
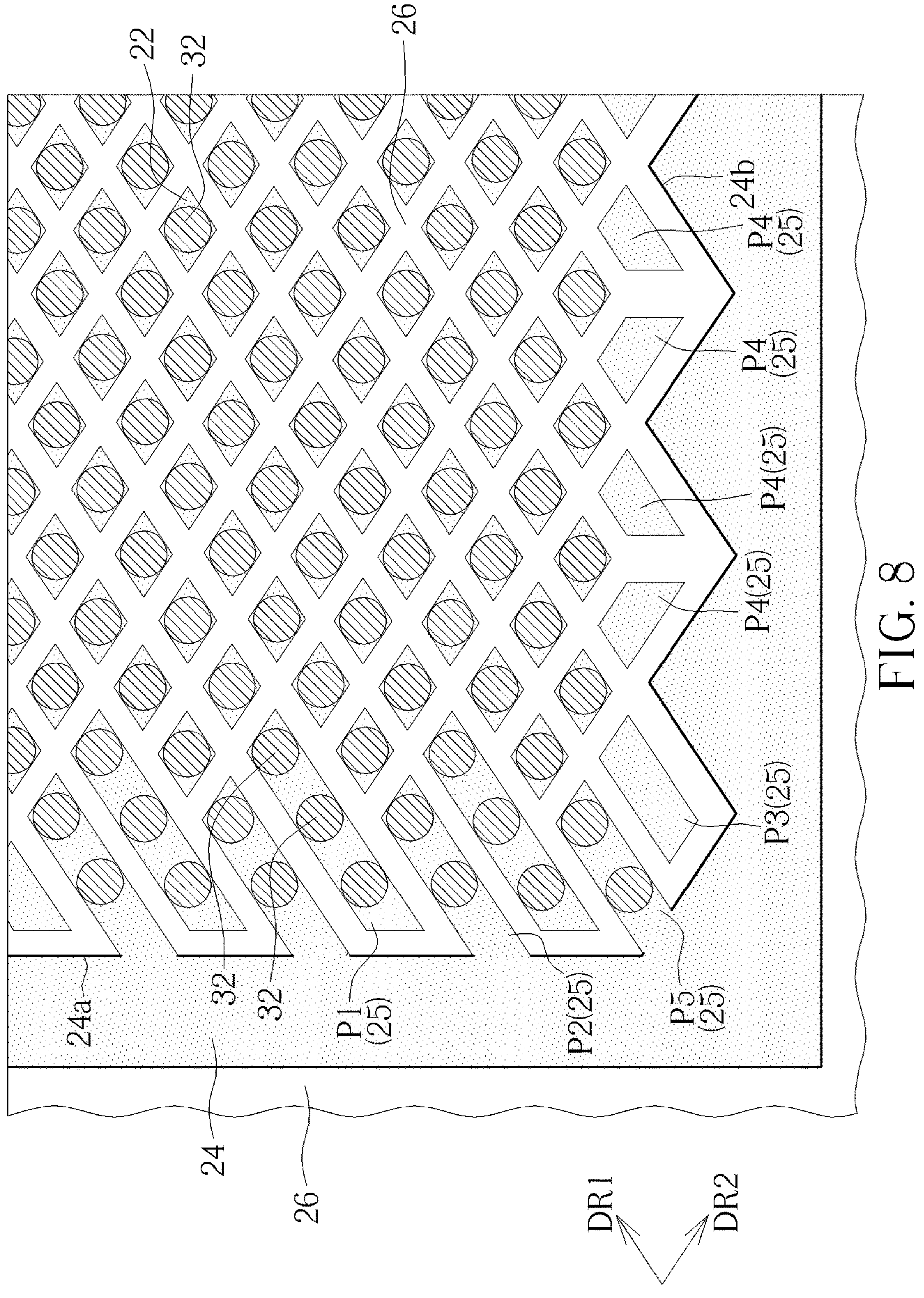
FIG. 8 is a partial enlarged view of a semiconductor device according to an embodiment of the present invention.

Please refer to FIG. 8, which shows another embodiment in which N is 2. The first extending pads P1 respectively have three bottom electrodes 32 disposed thereon. The second extending pads P2 and the fifth extending pad P5 respectively have two bottom electrodes 32 disposed thereon. The fourth extending pads P4 and the third extending pad P3 respectively have no bottom electrode 32 disposed thereon.

In summary, the semiconductor device provided by the present invention may have reinforced structure particularly at the peripheral portions of the capacitor structure. The risks of structural deformation or collapse may be reduced. The integrity, stability and quality of the semiconductor device provided by the present invention may be overall improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
- a substrate;
- a connecting layer on the substrate and comprising:
  - an array of connecting pads comprising a plurality of connecting pads arranged along a first direction and a second direction and separated from each other;
  - a peripheral structure comprising a first edge and a second edge adjacent to two adjacent sides of the array of connecting pads; and
  - a plurality of first extending pads arranged between the first edge of the peripheral structure and the array of connecting pads; and
- a capacitor structure comprising a plurality of bottom electrodes disposed on the connecting layer, wherein the connecting pads respectively have one of the bottom electrodes disposed thereon, the first extending pads respectively have at least two of the bottom electrodes disposed thereon.

2. The semiconductor device according to claim 1, wherein the first edge and the second edge of the peripheral structure extend along different directions and are connected by a third edge of the peripheral structure, wherein the semiconductor device further comprises:
- a third extending pad arranged between the third edge and the array of connecting pads; and
- a plurality of fourth extending pads arranged between the second edge and the array of connecting pads, wherein along the first direction, lengths of the first extending pads are larger than a length of the third extending pad, and the length of the third extending pad is larger than lengths of the fourth extending pads.

3. The semiconductor device according to claim 2, wherein the fourth extending pads alternately have one of the bottom electrodes disposed thereon.

4. The semiconductor device according to claim 2, further comprising:
- a fifth extending pad arranged between one of the first extending pads and the third extending pad and physically connected to the third edge, wherein along the first direction, a length of the fifth extending pad is larger than the length of the third extending pad and smaller than the lengths of the first extending pads.

5. The semiconductor device according to claim 4, wherein the fifth extending pad has one of the bottom electrodes disposed thereon.

6. The semiconductor device according to claim 1, further comprising:
- a plurality of second extending pads arranged alternately with the first extending pads and between the first edge of the peripheral structure and the array of connecting pads, wherein the second extending pads respectively have one of the bottom electrodes disposed thereon.

7. The semiconductor device according to claim 6, wherein along the first direction, lengths of the first extending pads are larger than lengths of the second extending pads.

8. The semiconductor device according to claim 6, wherein the second extending pads are physically connected to the first edge of the peripheral structure, the first extending pads are physically separated from the first edge of the peripheral structure by a dielectric layer.

9. The semiconductor device according to claim 6, wherein the first edge and the second edge of the peripheral structure extend along different directions and are connected by a third edge of the peripheral structure, wherein the semiconductor device further comprises:
- a third extending pad arranged between the third edge and the array of connecting pads; and
- a plurality of fourth extending pads arranged between the second edge and the array of connecting pads, wherein along the first direction, lengths of the second extending pads are larger than a length of the third extending pad, and the length of the third extending pad is larger than lengths of the fourth extending pads.

10. The semiconductor device according to claim 9, further comprising:
- a fifth extending pad arranged between one of the first extending pads and the third extending pad and physically connected to the third edge, wherein along the first direction, a length of the fifth extending pad is larger than the length of the third extending pad and smaller than the lengths of the second extending pads.

11. The semiconductor device according to claim 1, wherein the first edge of the peripheral structure has a straight profile, the second edge has a wave profile.

12. A semiconductor device, comprising:
- a substrate;
- a connecting layer on the substrate and comprising:
  - an array of connecting pads comprising a plurality of connecting pads arranged along a first direction and a second direction;
  - a peripheral structure comprising a first edge and a second edge adjacent to two adjacent sides of the array of connecting pads; and
  - a plurality of first extending pads and second extending pads alternately arranged between the first edge of the peripheral structure and the array of connecting pads, wherein along the first direction, lengths of the first extending pads are larger than lengths of the second extending pads; and
- a capacitor structure comprising a plurality of bottom electrodes disposed on the connecting layer, wherein the connecting pads respectively have one of the bottom electrodes disposed thereon, the first extending pads respectively have a number N+1 of the bottom electrodes disposed thereon, wherein the number N is an integer number of 0, 1, or 2, the second extending pads respectively have the number N of the bottom electrodes disposed thereon.

13. The semiconductor device according to claim 12, wherein the second extending pads are physically connected to the first edge of the peripheral structure, the first extending pads are physically separated from the first edge of the peripheral structure by a dielectric layer.

14. The semiconductor device according to claim 12, wherein the first edge of the peripheral structure has a straight profile, the second edge has a wave profile.

15. The semiconductor device according to claim 12, wherein the first edge and the second edge of the peripheral structure extend along different directions and are connected by a third edge of the peripheral structure, wherein the semiconductor device further comprises:

a third extending pad arranged between the third edge and the array of connecting pads; and a plurality of fourth extending pads arranged between the second edge and the array of connecting pads, wherein along the first direction, lengths of the first extending pads are larger than a length of the third extending pad, and the length of the third extending pad is larger than lengths of the fourth extending pads.

16. The semiconductor device according to claim 15, wherein the lengths of the second extending pads are larger than the length of the third extending pad.

17. The semiconductor device according to claim 15, wherein the fourth extending pads alternately have one of the bottom electrodes disposed thereon.

18. The semiconductor device according to claim 15, further comprising:

a fifth extending pad arranged between one of the first extending pads and the third extending pad and physically connected to the third edge, wherein along the first direction, a length of the fifth extending pad is larger than the length of the third extending pad and smaller than the lengths of the second extending pads.

19. The semiconductor device according to claim 18, wherein the fifth extending pad has the number N of the bottom electrodes disposed thereon.

* * * * *